United States Patent
Tseng et al.

(10) Patent No.: US 10,497,456 B2
(45) Date of Patent: Dec. 3, 2019

(54) VOLTAGE HOLDING CIRCUIT AND ELECTRONIC DEVICE USING THE SAME

(71) Applicant: Nuvoton Technology Corporation, Hsinchu (TW)

(72) Inventors: Hua-Chun Tseng, Hsinchu (TW); Tu-Hsiu Wang, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 16/232,083

(22) Filed: Dec. 26, 2018

(65) Prior Publication Data

US 2019/0206505 A1   Jul. 4, 2019

(30) Foreign Application Priority Data

Dec. 29, 2017 (TW) .............................. 106146375 A

(51) Int. Cl.
*G11C 27/02* (2006.01)
*G05F 3/08* (2006.01)

(52) U.S. Cl.
CPC .............. *G11C 27/024* (2013.01); *G05F 3/08* (2013.01)

(58) Field of Classification Search
CPC ............................. G11C 27/02; G11C 27/024
USPC .................................................. 327/541, 94
See application file for complete search history.

(56) References Cited

U.S. PATENT DOCUMENTS

| 7,332,940 B2 | 2/2008 | Watanabe |
| 2018/0019020 A1* | 1/2018 | Vilas Boas .......... G11C 27/024 |

FOREIGN PATENT DOCUMENTS

| CN | 106297710 | 1/2017 |
| JP | 2005072353 | 3/2005 |
| JP | 2005328599 | 11/2005 |
| TW | 347477 | 12/1998 |
| TW | 201229714 | 7/2012 |
| TW | I437820 | 5/2014 |
| TW | 201622359 | 6/2016 |

* cited by examiner

*Primary Examiner* — Tomi Skibinski
(74) *Attorney, Agent, or Firm* — JCIPRNET

(57) ABSTRACT

A voltage holding circuit and an electronic device using thereof are provided. The voltage holding circuit includes a first transistor, a second transistor, and a first capacitor. A first terminal of the first transistor is coupled to an input voltage, and a control terminal of the first transistor receives a control signal. A first terminal of the second transistor is coupled to a second terminal of the first transistor, a second terminal of the second transistor is an output terminal of the voltage holding circuit, and a control terminal of the second transistor receives the control signal. A first terminal of the first capacitor is coupled to the second terminal of the first transistor and the first terminal of the second transistor. A holding voltage on the first terminal of the first capacitor is maintained by the first capacitor and parasitic diodes of the first transistor and the second transistor.

10 Claims, 3 Drawing Sheets

US 10,497,456 B2

VOLTAGE HOLDING CIRCUIT AND ELECTRONIC DEVICE USING THE SAME

CROSS-REFERENCE TO RELATED APPLICATION

This application claims the priority benefit of Taiwan application no. 106146375, filed on Dec. 29, 2017. The entirety of the above-mentioned patent application is hereby incorporated by reference herein and made a part of this specification.

BACKGROUND OF THE INVENTION

Field of the Invention

The invention relates to a voltage holding technique, and particularly relates to a voltage holding circuit.

Description of Related Art

In a circuit design technique, a voltage reference circuit is usually used to produce a reference voltage. In order to make the reference voltage unaffected by temperature, a bandgap circuit is generally applied to implement the voltage reference circuit. However, when the voltage reference circuit operates, it still consumes electric power.

Therefore, a voltage holding element may be configured at an output terminal of the voltage reference circuit to maintain a voltage level of the reference voltage. Due to technological evolution of semiconductor manufacturing process, the conventional circuit layout of the voltage holding element probably cannot be adapted to a high-class manufacturing process, and since a thickness of semiconductor element becomes thinner, electric leakage is liable to be occurred. Therefore, in order to be adapted to the high-class semiconductor manufacturing process, the circuit layout of the voltage holding element is required to be properly adjusted and changed.

SUMMARY OF THE INVENTION

The invention is directed to a voltage holding circuit and an electronic device using the same, where the voltage holding circuit is adapted to a high-class semiconductor manufacturing process (for example, a 55 nm semiconductor manufacturing technique), the problem of electric leakage is resolved, and the voltage holding circuit is able to prolong a voltage level maintaining time of a reference voltage.

The invention provides a voltage holding circuit including a first transistor, a second transistor, and a first capacitor. A first terminal of the first transistor is coupled to an input voltage, a control terminal of the first transistor receives a control signal. A first terminal of the second transistor is coupled to a second terminal of the first transistor, a second terminal of the second transistor is an output terminal of the voltage holding circuit, and a control terminal of the second transistor receives the control signal. A first terminal of the first capacitor is coupled to the second terminal of the first transistor and the first terminal of the second transistor. A holding voltage on the first terminal of the first capacitor is maintained by the first capacitor and parasitic diodes of the first transistor and the second transistor when the first transistor and the second transistor are turned off.

The invention provides an electronic device including a voltage reference circuit, a voltage holding device, and a load circuit. The voltage reference circuit is configured to generate a reference voltage. The voltage holding device includes at least one voltage holding circuit. The voltage holding device is coupled to the voltage reference circuit to receive the reference voltage. The load circuit is coupled to the voltage holding device, and is configured to receive the held reference voltage from an output terminal of the voltage holding device. Each of the voltage holding circuits includes a first transistor, a second transistor, a first capacitor and a second capacitor. A first terminal of the first transistor is coupled to an input voltage related to the reference voltage, and a control terminal of the first transistor receives a control signal. A first terminal of the second transistor is coupled to a second terminal of the first transistor, a second terminal of the second transistor is an output terminal of the voltage holding circuit, and a control terminal of the second transistor receives the control signal. A first terminal of the first capacitor is coupled to the second terminal of the first transistor and the first terminal of the second transistor. A first terminal of the second capacitor is coupled to the second terminal of the second transistor to maintain a voltage on the second terminal of the second transistor. A holding voltage on the first terminal of the first capacitor, voltages on the first capacitor and the second capacitor are maintained by the first capacitor, the second capacitor and parasitic diodes of the first transistor and the second transistor when the first transistor and the second transistor are turned off.

According to the above description, the embodiments of the invention provide the voltage holding circuit and the electronic device using the same, and the voltage holding circuit is implemented through two transistors and two capacitors, and the parasitic diodes in the two transistors are applied to block a leakage path probably contacted by the reference voltage, so as to effectively maintain a voltage level thereof through the characteristic of the capacitor. In other words, the voltage holding circuit of the invention may maintain the voltages on the first capacitor and the second capacitor through the first capacitor, the second capacitor and the parasitic diodes of the first transistor and the second transistor. On the other hand, by connecting the voltage holding circuits in series or in parallel, the voltage level of the reference voltage is more effectively maintained, so as to prolong the voltage level maintaining time.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
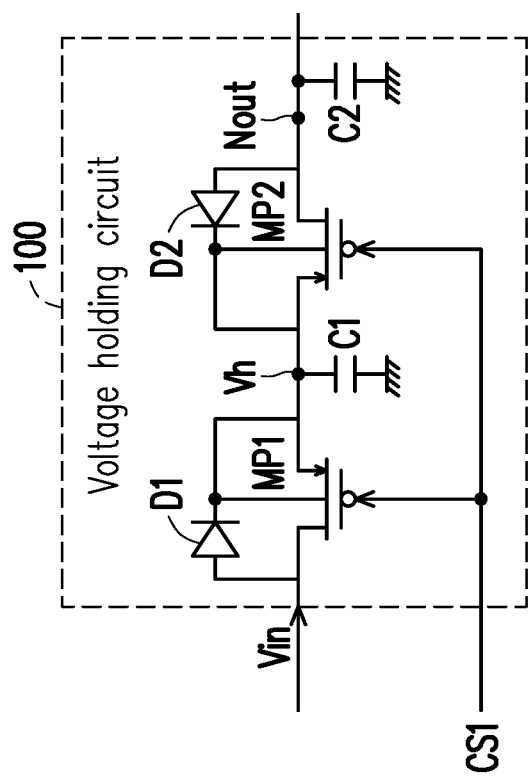
FIG. 1 is a circuit diagram of a voltage holding circuit according to a first embodiment of the invention.

FIG. 1 is a circuit diagram of a voltage holding circuit 100 according to a first embodiment of the invention. The voltage holding circuit 100 may be applied to an output terminal of a voltage reference circuit (for example, a bandgap circuit) to maintain a reference voltage output by the voltage reference circuit. The voltage holding circuit 100 includes a first transistor (which is, for example, a P-type transistor MP1), a second transistor (which is, for example, a P-type transistor MP2) and a first capacitor C1. The voltage holding circuit 100 of the present embodiment may further include a second capacitor C2.

A first terminal (a drain) of the first transistor MP1 is coupled to an input voltage Vin, a control terminal (a gate) of the first transistor MP1 receives a control signal CS1. A first terminal (a source) of the second transistor MP2 is coupled to a second terminal (a source) of the first transistor MP1, a second terminal (a drain) of the second transistor MP2 is an output terminal Nout of the voltage holding circuit 100. A control terminal (a gate) of the second transistor MP2 receives the control signal CS1. In other words, the first transistor MP1 and the second transistor MP2 are all controlled by the control signal CS1. A first terminal of the first capacitor C1 is coupled to the second terminal (the source) of the first transistor MP1 and the first terminal (the source) of the second transistor MP2, and a first terminal of the second capacitor C2 is coupled to the second terminal of the second transistor MP2 (i.e. the output terminal Nout of the voltage holding circuit 100). Second terminals of the first capacitor C1 and the second capacitor C2 are coupled to ground. The second capacitor C2 is used for maintaining a voltage on the second terminal of the second transistor MP2 (i.e. the output terminal Nout of the voltage holding circuit 100).

According to the above circuit structure of the voltage holding circuit 100, it is known that a first parasitic diode D1 is included between the first terminal (the drain) of the first transistor MP1 and a base of the first transistor MP1, and a second parasitic diode D2 is included between the second terminal (the drain) of the second transistor MP2 and a base of the second transistor MP2. In this way, when the first transistor MP1 and the second transistor MP2 are turned off, as long as the first terminal (the drain) of the first transistor MP1 and the second terminal (the drain) of the second transistor MP2 are not electrically connected to a leakage path, a holding voltage Vh on a first terminal of the first capacitor C1 is maintained by the first capacitor C1, the second capacitor C2, the first parasitic diode D1 and the second parasitic diode D2. In detail, the parasitic diodes D1 and D2 of the first transistor MP1 and the second transistor MP2 maintains the voltage on the second capacitor C2 by maintaining the voltage on the first capacitor C1 when the first transistor MP1 and the second transistor MP2 are turned off. The voltage holding circuit of the present embodiment may be implemented by a 55 nm semiconductor manufacturing process. In other words, in the high-class semiconductor manufacturing process, the embodiment of the invention applies the parasitic diodes in the two transistors to block the leakage path probably contacted by the reference voltage, and avoid the base of the transistor to become the leakage path, so as to more effectively maintain the holding voltage Vh. According to an experiment, it is known that under a normal temperature, the voltage holding circuit 100 may maintain the voltage level of the holding voltage Vh for 300 ms, or even maintain the voltage level of the holding voltage Vh for 10 seconds in extreme conditions. The above data may be slightly changed under different semiconductor manufacturing processes, temperatures, circuit structures and other conditions.

Figure 2:
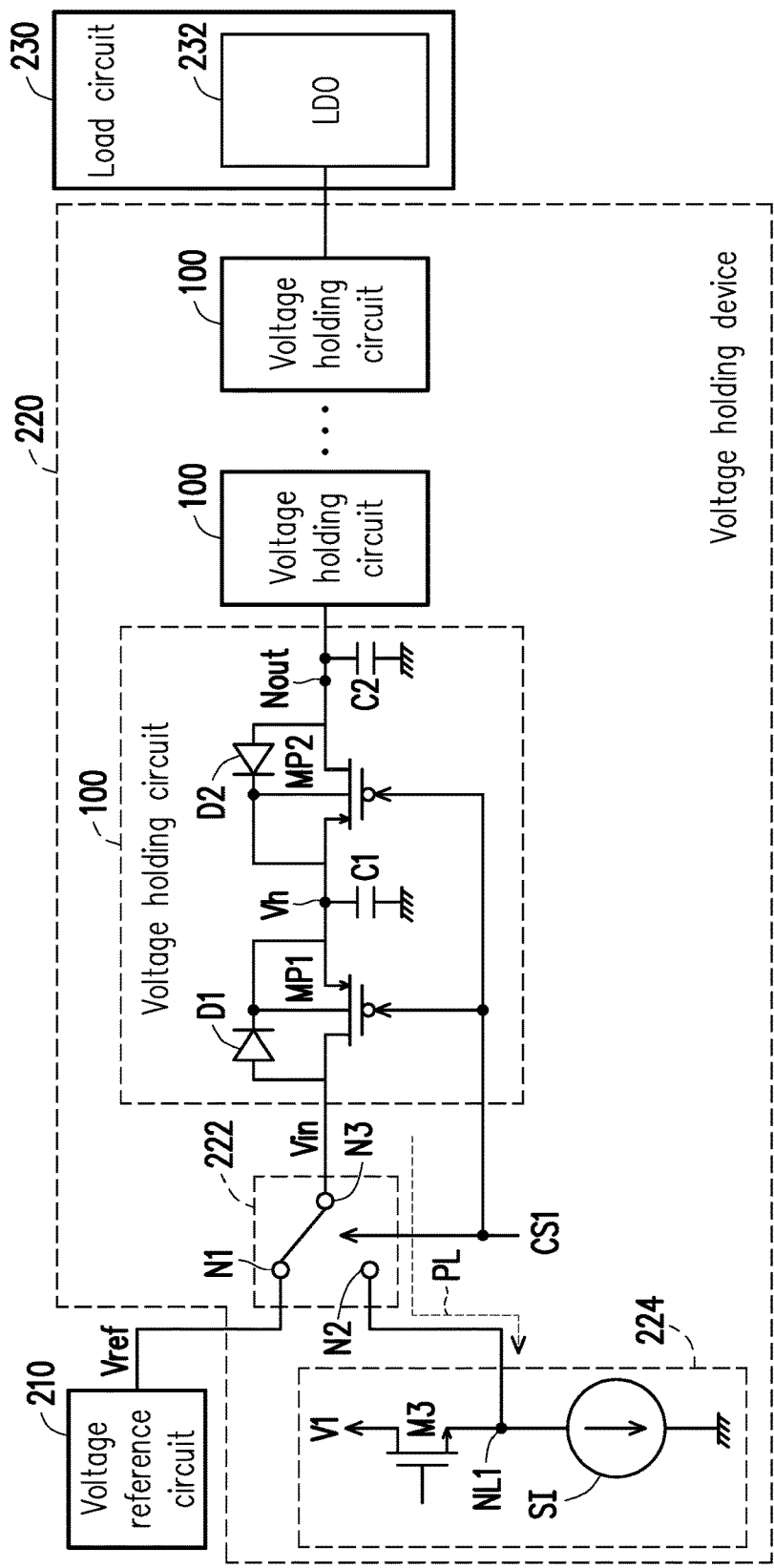
FIG. 2 is a circuit diagram of an electronic device according to a second embodiment of the invention.

FIG. 2 is a circuit diagram of an electronic device 200 according to a second embodiment of the invention. As shown in FIG. 2, the electronic device 200 includes a voltage reference circuit 210, a voltage holding device 220 and a load circuit 230. The voltage reference circuit 210 is configured to generate a reference voltage Vref. The voltage holding device 220 includes at least one voltage holding circuit 100. The voltage holding device 220 of FIG. 2 includes a plurality of voltage holding circuits 100 connected in series. The voltage holding device 220 is coupled to the voltage reference circuit 210 to receive the reference voltage Vref. The load circuit 230 is coupled to the voltage holding device 220, and is configured to receive the held reference voltage from an output terminal of the voltage holding device 220. The load circuit 230 generally uses the held reference voltage as a reference for voltage comparison. The load circuit 230 may include a low dropout (LDO) regulator 232 to maintain the voltage level of the held reference voltage.

The voltage holding device 220 mainly includes at least one voltage holding circuit 100, and in the embodiment of FIG. 2, a plurality of voltage holding circuits 100 connected in series is taken as an example for description. In the present embodiment, the second capacitor C2 is configured at the output terminal of each of the voltage holding circuits 100 to maintain a voltage level of the output terminal of each of the voltage holding circuits 100. The more the number of the voltage holding circuits 100 connected in series is, the longer a voltage level maintaining time of the holding voltage Vh is. The circuit structure of each of the voltage holding circuits 100 in FIG. 2 is the same with that of FIG. 1. The voltage holding device 220 includes a path switch 222 and a leakage circuit 224. An intention of configuring the path switch 222 and the leakage circuit 224 is that when the electronic device 200 is actually operated, if the output terminal of the voltage reference circuit 210 cannot leaks electricity, the voltage reference circuit 210 probably cannot learn when to reactivate to charge the reference voltage Vref. Therefore, in the present embodiment, the path switch 222 and the leakage circuit 224 are applied to create a leakage path, such that the voltage holding circuit 100 in FIG. 2 may leak the holding voltage Vh.

A first terminal N1 of the path switch 222 is coupled to the voltage reference circuit 210 to receive the reference voltage Vref. A third terminal N3 of the path switch 222 is coupled to an input terminal of the voltage holding circuit 100, and a control terminal of the path switch 222 is coupled to the control signal CS1. An input terminal NL1 of the leakage circuit 224 is coupled to a second terminal N2 of the path switch 222. When the control signal CS1 is enabled, the first terminal N1 of the path switch 222 is coupled to the third terminal N3 of the path switch 222, such that the holding voltage Vh in the voltage holding circuit 100 is equal to the reference voltage Vref, and the holding voltage Vh is maintained by the first capacitor C1, the second capacitor C2 and the parasitic diodes D1 and D2 of the first transistor MP1 and the second transistor MP2. On the other hand, when the control signal CS1 is disabled, the second terminal N2 of the path switch 222 is coupled to the third terminal N3 of the path switch 222, and the first terminal of the first capacitor C1 in the voltage holding circuit 100 is coupled to a potential lower than the reference voltage Vref, such that the holding voltage Vh may implement charge release through the leakage path PL.

The leakage circuit 224 of the present embodiment includes a third transistor M3 and a current source SI. The third transistor M3 may be an N-type transistor. A first terminal (a drain) of the third transistor M3 is coupled to a first power V1. A second terminal (a source) of the third transistor M3 is coupled to a first terminal of the current source SI to serve as the input terminal NL1 of the leakage circuit 224. A third terminal (a gate) of the third transistor M3 is coupled to the output terminal Nout of the voltage holding circuit 100, and a second terminal of the current source SI is coupled to ground. In this way, when the second terminal N2 and the third terminal N3 of the path switch 222 are coupled to each other, a voltage level at the input terminal NL1 of the leakage circuit 224 is lower than the voltage level at the output terminal Nout of the voltage holding circuit 100, such that the leakage path PL may be effective.

Figure 3:
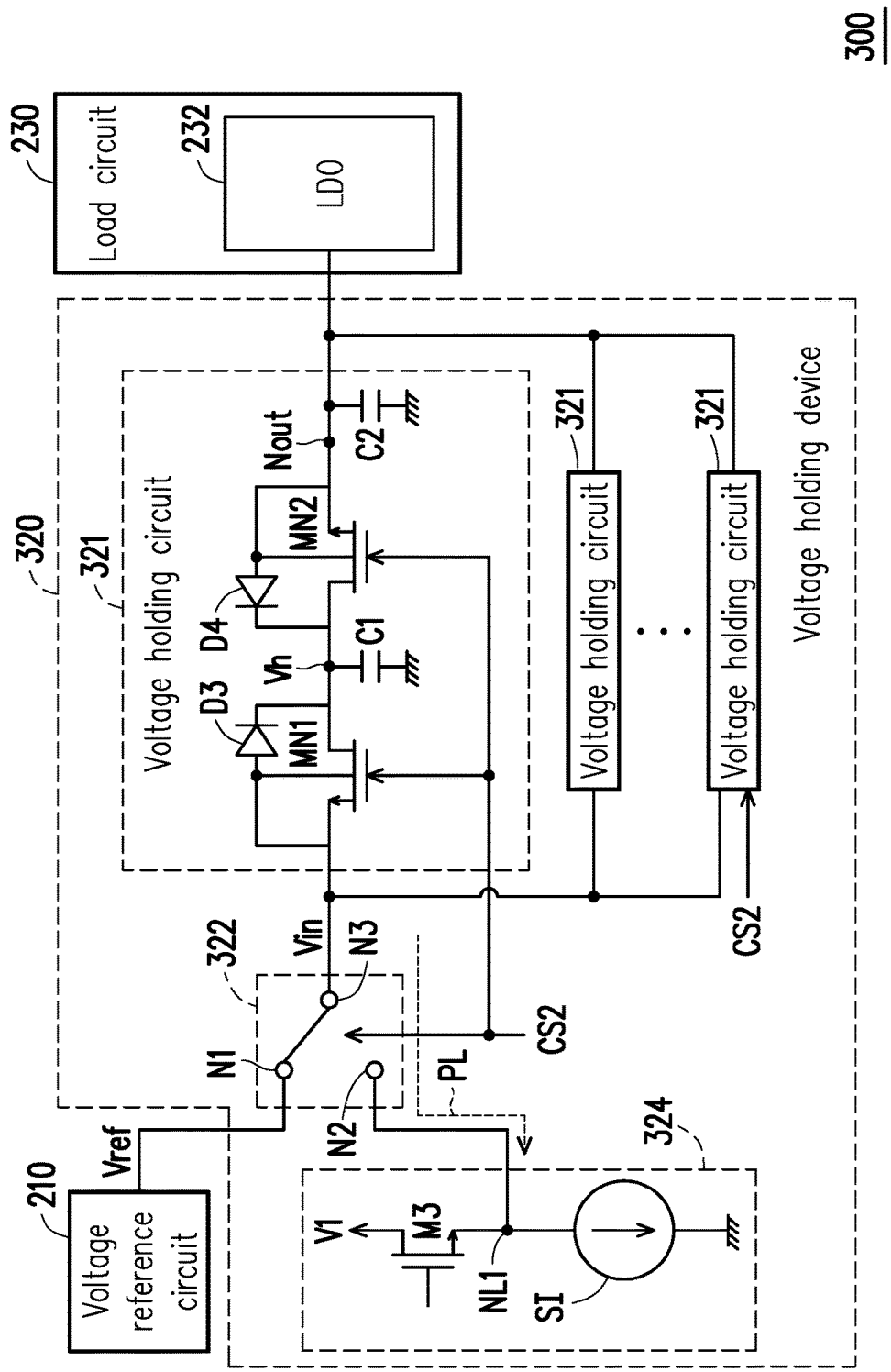
FIG. 3 is a circuit diagram of an electronic device according to a third embodiment of the invention.

FIG. 3 is a circuit diagram of an electronic device 300 according to a third embodiment of the invention. The electronic device 300 of FIG. 3 is similar to the electronic device 200 of FIG. 2, for example, the circuit structures of the path switch 322 and the leakage circuit 324 in FIG. 3 are the same to the circuit structures of the path switch 222 and the leakage circuit 224 in FIG. 2. Differences between the two embodiments are that the voltage holding circuit 321 of FIG. 3 is implemented by two N-type transistors MN1 and MN2; a first parasitic diode D3 is included between a base and a drain of the N-type transistor MN1 and a second parasitic diode D4 is included between a base and a drain of the N-type transistor MN2; the N-type transistors MN1, MN2 and the path switch 222 are controlled by a control signal CS2. A difference between the control signal CS2 of FIG. 3 and the control signal CS1 of FIG. 1 and FIG. 2 only lies in opposite signal polarities (for example, logic "1" and logic "0" are opposite). The other circuit structure of the voltage holding circuit 321 of FIG. 3 is similar to the voltage holding circuit 100 of FIG. 1 and FIG. 2. Moreover, the voltage holding circuits 321 in FIG. 3 are connected in parallel, and the voltage holding circuits 100 in FIG. 2 are connected in series. In the embodiments of the invention, by connecting the voltage holding circuits in series (as shown in FIG. 2) or in parallel (as shown in FIG. 3), the voltage level of the reference voltage Vref is more effectively maintained, so as to prolong the voltage level maintaining time.

In summary, the embodiments of the invention provide the voltage holding circuit and the electronic device using the same, and the voltage holding circuit is implemented through two transistors and two capacitors, and the parasitic diodes in the two transistors are applied to block the leakage path probably contacted by the reference voltage, so as to effectively maintain the voltage level thereof through the characteristic of the capacitor. In other words, the voltage holding circuit of the invention may maintain the voltages on the first capacitor and the second capacitor through the first capacitor, the second capacitor and the parasitic diodes of the first transistor and the second transistor. On the other hand, by connecting the voltage holding circuits in series or in parallel, the voltage level of the reference voltage is more effectively maintained, so as to prolong the voltage level maintaining time.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A voltage holding circuit, comprising:
   a first transistor, having a first terminal coupled to an input voltage, and a control terminal receiving a control signal;
   a second transistor, having a first terminal coupled to a second terminal of the first transistor, a second terminal being an output terminal of the voltage holding circuit, and a control terminal receiving the control signal; and
   a first capacitor, having a first terminal coupled to the second terminal of the first transistor and the first terminal of the second transistor,
   wherein a holding voltage on the first terminal of the first capacitor is maintained by the first capacitor and parasitic diodes of the first transistor and the second transistor when the first transistor and the second transistor are turned off.

2. The voltage holding circuit as claimed in claim 1, wherein the first transistor comprises a first parasitic diode between the first terminal and a base thereof, and the second transistor comprises a second parasitic diode between the second terminal and a base thereof,
   wherein the holding voltage is maintained by the first capacitor, the first parasitic diode and the second parasitic diode.

3. The voltage holding circuit as claimed in claim 1, wherein the voltage holding circuit is implemented by a 55 nm semiconductor manufacturing process.

4. The voltage holding circuit as claimed in claim 1, further comprising:
   a second capacitor, coupled to the output terminal of the voltage holding circuit to maintain a voltage at the output terminal.

5. The voltage holding circuit as claimed in claim 4, wherein the parasitic diodes in the first transistor and the second transistor maintain the voltage on a second capacitor by maintaining a voltage on the first capacitor when the first transistor and the second transistor are turned off.

6. An electronic device, comprising:
   a voltage reference circuit, configured to generate a reference voltage;
   a voltage holding device, comprising at least one voltage holding circuit, and the voltage holding device is coupled to the voltage reference circuit to receive the reference voltage; and
   a load circuit, coupled to the voltage holding device, and configured to receive the held reference voltage from an output terminal of the voltage holding device,
   wherein each of the voltage holding circuits comprises:
     a first transistor, having a first terminal coupled to an input voltage related to the reference voltage, and a control terminal receiving a control signal;
     a second transistor, having a first terminal coupled to a second terminal of the first transistor, a second terminal being an output terminal of the voltage holding circuit, and a control terminal receiving the control signal;
     a first capacitor, having a first terminal coupled to the second terminal of the first transistor and the first terminal of the second transistor; and
     a second capacitor, having a first terminal coupled to the second terminal of the second transistor to maintain a voltage on the second terminal of the second transistor, wherein a holding voltage on the first terminal of the first capacitor, voltages on the first capacitor and the second capacitor are maintained by the first capacitor, the second capacitor and parasitic diodes of the first transistor and the second transistor when the first transistor and the second transistor are turned off.

7. The electronic device as claimed in claim 6, wherein the voltage holding device further comprises
   a path switch, having a first terminal coupled to the voltage reference circuit to receive the reference voltage, a third terminal coupled to an input terminal of the at least one voltage holding circuit, and a control terminal coupled to the control signal; and
   a leakage circuit, having an input terminal coupled to a second terminal of the path switch,
   wherein when the control signal is enabled, the first terminal of the path switch is coupled to the third terminal of the path switch, such that the holding voltage in the at least one voltage holding circuit is equal to the reference voltage, and the holding voltage is maintained by the first capacitor, the second capacitor and the parasitic diodes of the first transistor and the second transistor,
   when the control signal is disabled, the second terminal of the path switch is coupled to the third terminal of the path switch, such that the first terminal of the second capacitor in the at least one voltage holding circuit is coupled to a potential lower than the reference voltage.

8. The electronic device as claimed in claim 7, wherein the leakage circuit comprises:
   a third transistor, having a first terminal coupled to a first power, a control terminal coupled to the output terminal of the voltage holding circuit; and
   a current source, having a first terminal coupled to a second terminal of the third transistor to serve as the input terminal of the leakage circuit, and a second terminal coupled to ground.

9. The electronic device as claimed in claim 6, wherein the at least one voltage holding circuit in the voltage holding device are connected in series.

10. The electronic device as claimed in claim 6, wherein the first transistor comprises a first parasitic diode between the first terminal and a base thereof, and the second transistor comprises a second parasitic diode between the second terminal and a base thereof,
    wherein the holding voltage is maintained by the first capacitor, the second capacitor, the first parasitic diode and the second parasitic diode.

* * * * *